United States Patent
Chen et al.

(10) Patent No.: US 9,543,381 B2
(45) Date of Patent: Jan. 10, 2017

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Chang-Yin Chen, Taipei (TW); Tung-Wen Cheng, New Taipei (TW); Che-Cheng Chang, New Taipei (TW); Po-Chi Wu, Hsinchu County (TW); Jr-Jung Lin, Hsinchu (TW); Chih-Han Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/483,636

(22) Filed: Sep. 11, 2014

(65) Prior Publication Data
US 2016/0079353 A1    Mar. 17, 2016

(51) Int. Cl.
*H01L 27/088* (2006.01)
*H01L 29/06* (2006.01)
*H01L 29/66* (2006.01)
*H01L 29/78* (2006.01)
(Continued)

(52) U.S. Cl.
CPC ....... *H01L 29/0638* (2013.01); *H01L 27/0886* (2013.01); *H01L 29/0649* (2013.01); *H01L 29/66545* (2013.01); *H01L 29/66795* (2013.01); *H01L 21/823431* (2013.01); *H01L 21/823437* (2013.01); *H01L 29/165* (2013.01); *H01L 29/7848* (2013.01)

(58) Field of Classification Search
None
See application file for complete search history.

(56) References Cited

U.S. PATENT DOCUMENTS

| 5,459,340 A | 10/1995 | Anderson et al. |
| 7,394,116 B2 | 7/2008 | Kim et al. |
| 2005/0263830 A1 | 12/2005 | Wang et al. |

(Continued)

FOREIGN PATENT DOCUMENTS

| KR | 2006-0000275 | 1/2006 |
| KR | 2007-0020644 | 2/2007 |

OTHER PUBLICATIONS

Office Action from Taiwan Intellectual Property Office dated May 16, 2016 for Taiwan application 103141336.
(Continued)

*Primary Examiner* — Reema Patel
(74) *Attorney, Agent, or Firm* — WPAT, P.C., Intellectual Property Attorneys; Anthony King

(57) ABSTRACT

Present disclosure provides a semiconductor structure, including a substrate having a center portion and an edge portion, an isolation layer over the substrate; a semiconductor fin with a top surface and a sidewall surface, partially positioning in the isolation layer, a first gate covering a portion of the top surface and a portion of the sidewall surface of the semiconductor fin, positioning at an edge portion of the substrate, and a second gate covering a portion of the top surface and a portion of the sidewall surface of the semiconductor fin, positioning at a center portion of the substrate. A lower width of the first gate in proximity to the isolation layer is smaller than an upper width of the first gate in proximity to top surface of the semiconductor fin.

19 Claims, 16 Drawing Sheets

(51) Int. Cl.
*H01L 29/165* (2006.01)
*H01L 21/8234* (2006.01)

(56) References Cited

U.S. PATENT DOCUMENTS

2008/0073723 A1  3/2008  Rachmady et al.
2010/0176491 A1  7/2010  Haberecht et al.

OTHER PUBLICATIONS

Search report from Taiwan Intellectual Property Office dated May 16, 2016 for Taiwan application 103141336.
Office Action from Korean Intellectual Property Office dated Jul. 28, 2016 for corresponding Korean application 9-5-2016-054729763.
English translation of the Office Action from Korean Intellectual Property Office dated Jul. 28, 2016 for corresponding Korean application 9-5-2016-054729763.
U.S. Pat. No. 7,394,116 corresponds to KR2006-0000275.
English abstract of KR2007-0020644.

SEMICONDUCTOR STRUCTURE AND MANUFACTURING METHOD OF THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
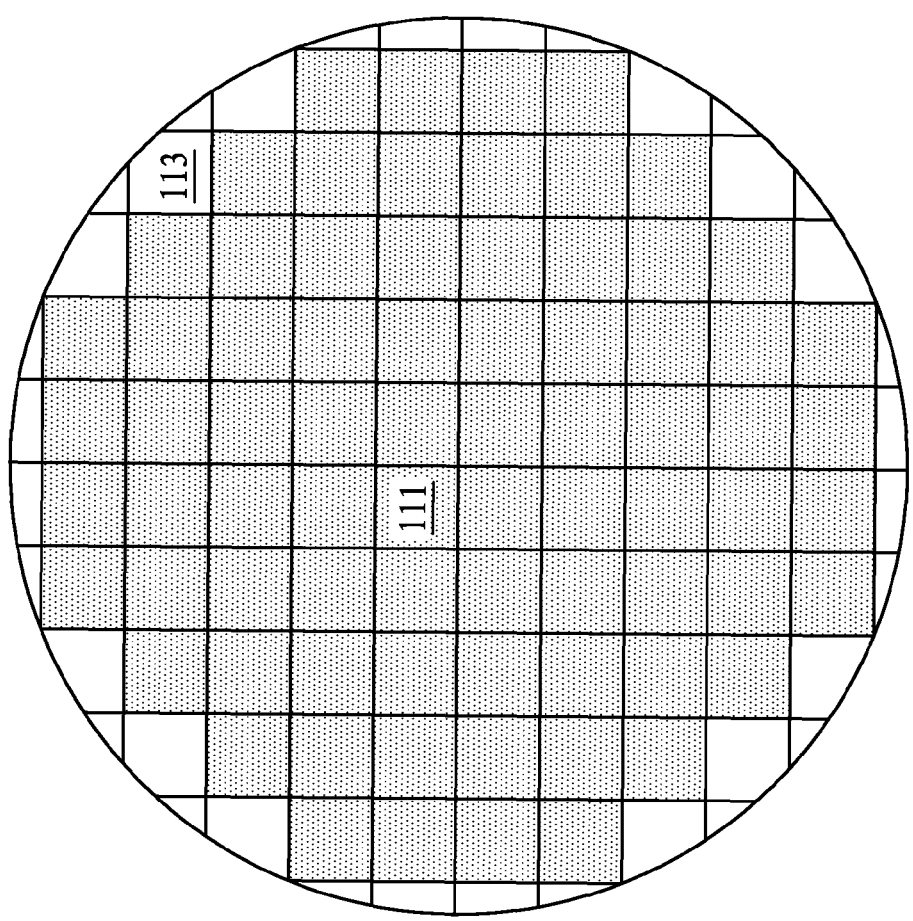
FIG. 1 shows a top view of a wafer having an edge portion and a center portion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Along with the decrease of the feature dimension in a field effect transistor (FET), the topography and structural uniformity are gaining less control. For example, a bottom gate profile in a FinFET structure can be either notching or footing, depending on the patterning environment (e.g. isolated pattern or dense pattern) and the position (e.g. edge of center) on a wafer or a substrate. When the channel length of a FinFET is reduced to, for example, 16 nm or below, excess footing feature at the bottom of the gate may produce electrical short bridging between the final gate electrode and the adjacent conductive regions such as source and/or drain region.

Furthermore, the footing feature at the bottom of the gate may alter the proximity of the raised source region and the proximity of the raised drain region partially below the gate electrode, causing uncontrollable proximity fluctuation between devices within the manufacturing wafer or substrate. Because the seriousness of the footing profile can have a distribution among all the devices within the wafer or the substrate, the breakdown voltage $V_{bd}$ vary between different devices. Hence, a $V_{bd}$ tailing can occur, indicating a substantial amount of devices are having low $V_{bd}$ problems. Hence, a notching feature, as opposed to the footing feature, is desired at the bottom of the gate to avoid above-mentioned problems.

Nevertheless, conditions for the formation of such notching feature are not uniform among all the semiconductor structure on a substrate or a wafer. For example, the etching rate between a center portion and an edge portion of the substrate may be different. The loading effect or topography effect between an isolated region and a dense region may be different. In order to achieve device within-in-wafer uniformity, the location and the pattern density shall be taken into account when preparing a semiconductor gate structure with notching feature on a wafer scale.

The present disclosure provides a FinFET structure having a lower width in proximity to an isolation layer supported thereunder, and an upper width in proximity to a top surface of a semiconductor fin. The lower width being smaller than the upper width not only in an isolated-patterned region but also in a dense-patterned region. Both the isolated-patterned region and the dense-patterned region are within a same chip fabricated under identical conditions. In addition, the present disclosure provides that the lower width being smaller than the upper width not only can be observed in a center portion but also in an edge portion of a wafer or a substrate.

The present disclosure also provides a method for manufacturing a semiconductor structure, for example, a FinFET structure, on a substrate. The semiconductor structure possesses various notching features discussed throughout the embodiments of the present disclosure.

Figure 2:
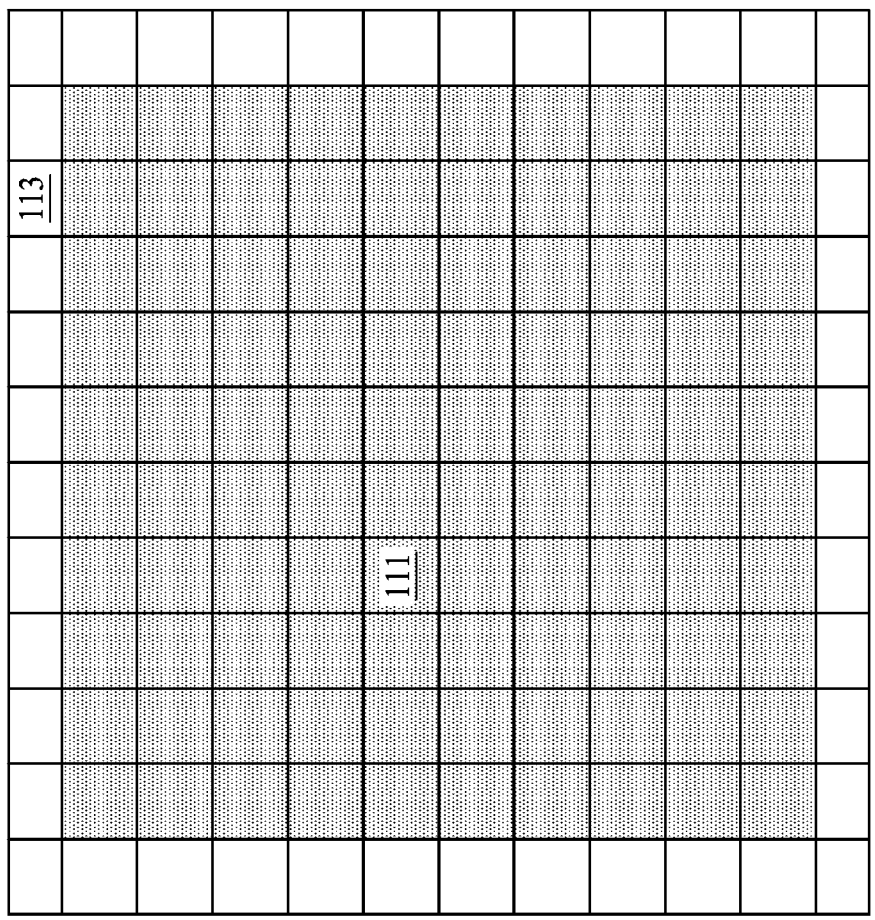
FIG. 2 shows a top view of a substrate having an edge portion and a center portion.

Referring to FIG. 1, the semiconductor wafer having several semiconductor dies is provided. Each area enclosed by a quadrilateral boundary is a semiconductor die. A semiconductor die 111 positioned at a center portion of the wafer, and a semiconductor die 113 positioned at an edge portion of the wafer are noted for reference. In some embodiments, the "edge portion" of the wafer includes the region where at least one side of the semiconductor die is in contact with the circumference of the semiconductor wafer. On the other hand, the "center portion" of the wafer includes the region other than the "edge portion". In other embodiments, the "edge portion" and the "center portion" can be a relative term where a center portion is closer to a wafer center than an edge portion, regardless of their exact positions on the semiconductor wafer. Similarly, as shown in FIG. 2, the semiconductor substrate is shown to have a center portion (marked with shades) and an edge portion (without shades), according to a first definition discussed above. The semiconductor substrate discussed herein includes various type of carrier used for accommodating semiconductor structures. Alternatively, comparing the relative positions of the semiconductor dies 111 and 113 with a substrate center, semiconductor die 111 is in a center portion while the semiconductor die 113 is in an edge portion, according to the second definition provided above.

Figure 3A:
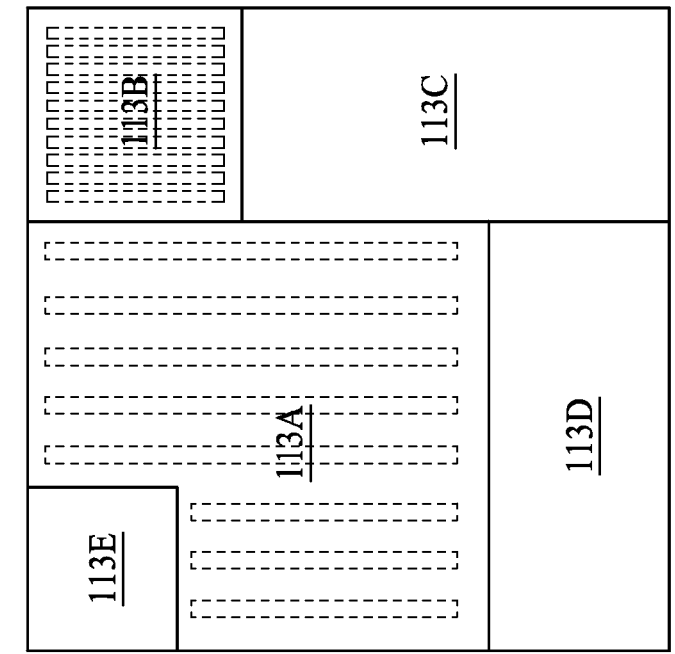
FIG. 3A shows a top view of a die having a dense-patterned region and an isolated-patterned region.
Figure 3B:
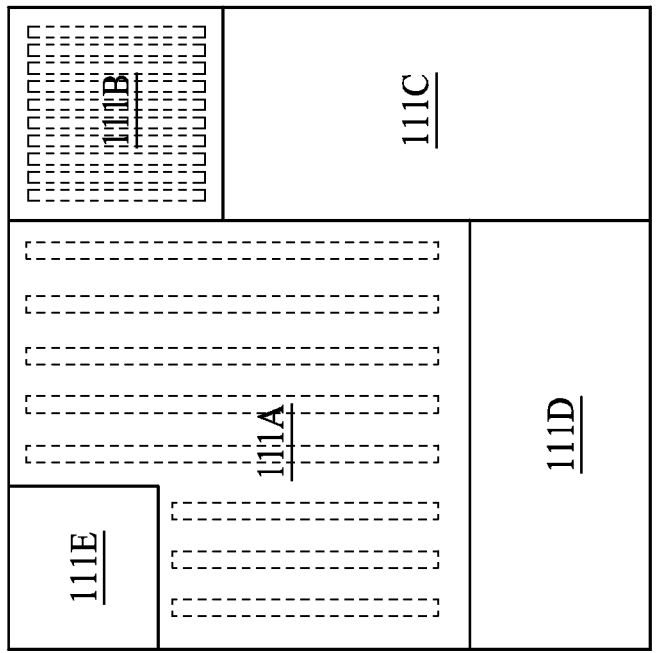
FIG. 3B shows a top view of a die having a dense-patterned region and an isolated-patterned region.

In FIGS. 3A and 3B, after a suitable die-saw operation, the semiconductor die on the wafer (see FIG. 1) or the substrate (see FIG. 2) is separated therefrom and individual semiconductor chip is formed. In FIG. 3A, semiconductor chip 111 is separated from a center portion of the semiconductor wafer or substrate, whereas in FIG. 3B, semiconductor chip 113 is separated from an edge portion of the semiconductor wafer or substrate. Several regions can be observed on a semiconductor chip from a top view perspective. For example, region 111A is an I/O region, region 111B is a logic region, region 111C is an analog region, region 111D is a memory region, and region 111E is a static random access memory (SRAM) region. Similarly, the same region classification applied to semiconductor chip 113 shown in FIG. 3B. In some embodiments, a greater line width and a greater separation between lines can be observed in the I/O region (111A, 113A), whereas a narrower line width and a narrower separation between lines is shown in the logic region (111B, 113B). In the present disclosure, the I/O region shown in FIGS. 3A and 3B can be referred to an isolated-patterned region, or an "isolated region" for simplicity, and the logic region shown in FIGS. 3A and 3B can be referred to a dense-patterned region, or a "dense region" for simplicity. The relative dimension shown in FIG. 3A and FIG. 3B are not drawn into scale, for example, the isolated region is not necessary to occupy a greater portion of the die than the dense region does. In some embodiments, a line width L1 in the isolated region (111A, 113A) is from about 8 to about 10 times the line width L2 in the dense region (111B, 113B).

Figure 4:
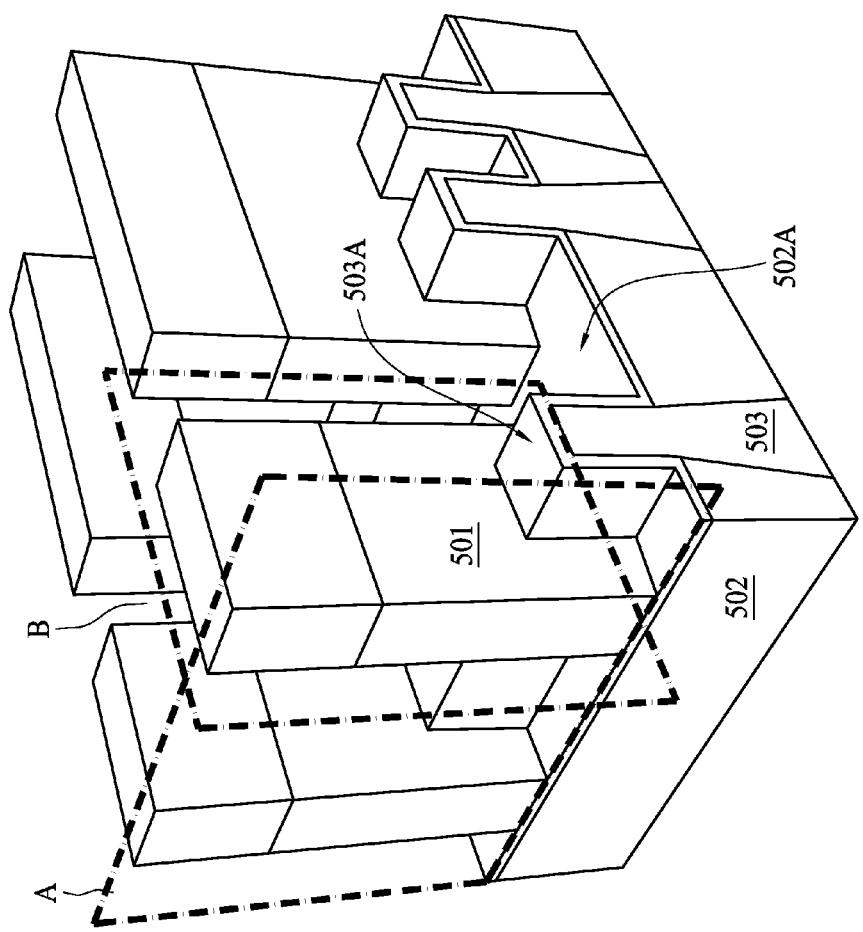
FIG. 4 shows a perspective view of a FinFET structure, in accordance with some embodiments of the present disclosure.

Referring to FIG. 4, a perspective view of a FinFET structure is provided. In FIG. 4, several semiconductor fin 503 are partially positioned in an isolation layer 502 such as a shallow trench isolation (STI). A gate 501 is positioned over the fin 503, wrapping a top surface 503A and two sidewall surfaces of the fin 503. Note a bottom of the gate 501 is positioned over a top surface 502A of the isolation layer 502. In FIG. 4, two mutually orthogonal plane A and plane B are marked, indicating two types of cross sectional views are provided in the subsequent drawings of the present disclosure. FIGS. 5-9, FIG. 12, FIG. 14, and FIG. 16 of the present disclosure are depicted according to the plane A as shown in FIG. 4. FIGS. 10-11, FIG. 13, and FIG. 15 of the present disclosure are depicted according to plane B as shown in FIG. 4. Plane A shows a surface of the semiconductor fin 503 parallel to a longitudinal direction thereof and a gate width (approximately to a channel length). Plane B shows a surface of the semiconductor fin 503 perpendicular to the longitudinal direction thereof.

Figure 5:
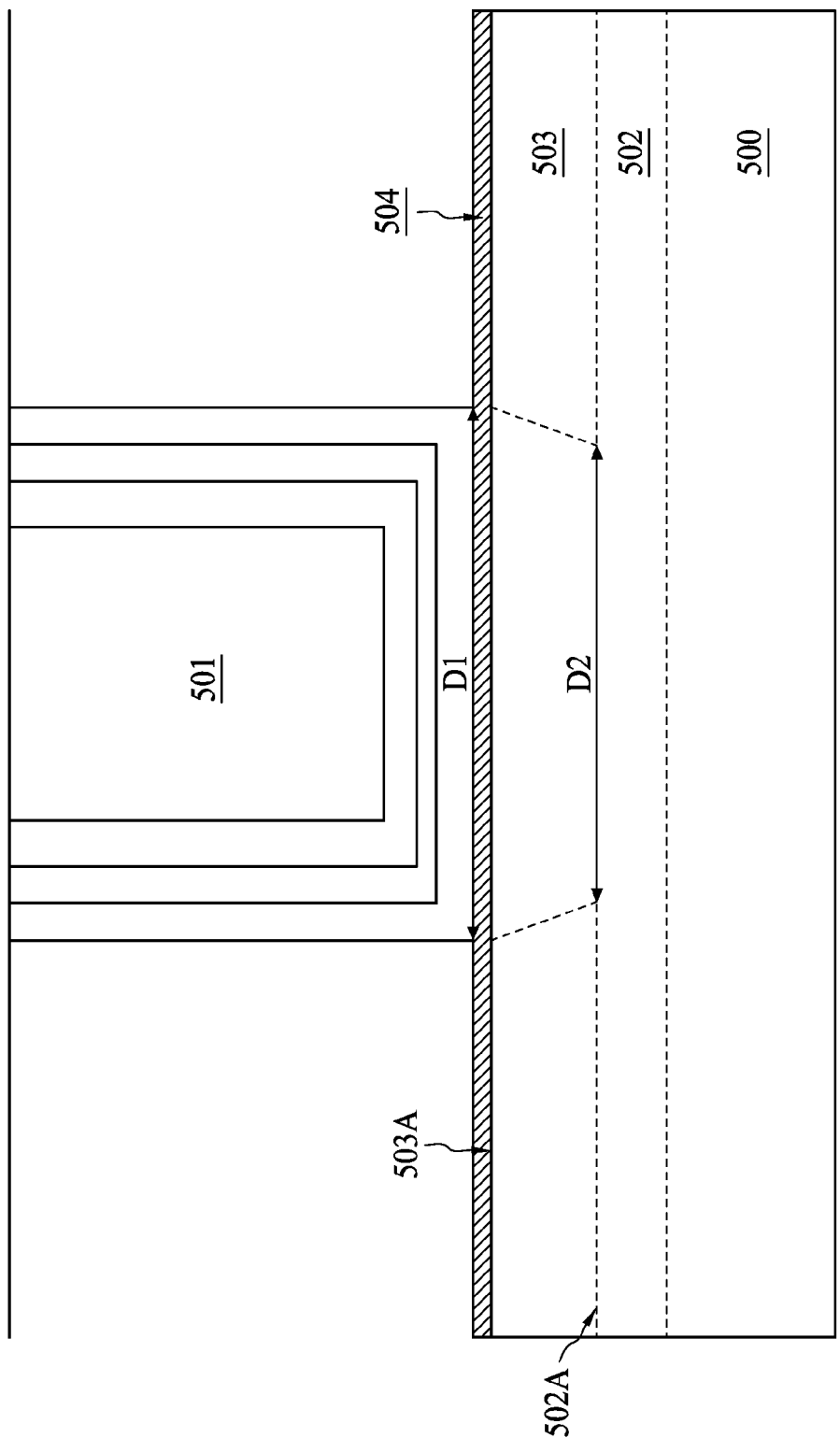
FIG. 5 shows a cross sectional view of a FinFET structure, in accordance with some embodiments of the present disclosure.

Referring to FIG. 5, a cross section according to plane A of a semiconductor structure in FIG. 4 is provided. The semiconductor structure include a substrate 500, an isolation layer 502 over the substrate 500, a semiconductor fin 503 partially positioned in the isolation layer 502, and a gate 501 over the semiconductor fin 503, wrapping a top surface 503A and a sidewall surface (not shown in FIG. 5) of the semiconductor fin 503. The sidewall surface of the semiconductor fin 503 can be referred to FIG. 10 of the present disclosure, where the sidewall surface 503B can be viewed from plane B in FIG. 4. Note the dotted lines shown in FIG. 5 refer to physical boundaries of different layers discussed above not situated on an identical plane. For example, the semiconductor fin 503 is partially embedded in the isolation layer 502, such that a portion of the semiconductor fin 503 above the isolation layer 502 is depicted, and another portion of the semiconductor fin 503 surrounded by the isolation layer 502 is not depicted. For another example, because the gate 501 is wrapping the top surface 503A and sidewall surfaces of the semiconductor fin 503, the dotted lines shown in the semiconductor fin 503 represents the portion of the gate 501 wrapping the sidewall surfaces of the semiconductor fin 503.

In FIG. 5, the gate 501 lands on the semiconductor fin 503 at a top surface 502A of the semiconductor fin 503 and at a top surface 502A of the isolation layer 502. A lower width D2 shown in FIG. 5 is a gate width measured in proximity to the top surface 502A of the isolation layer 502. An upper width D1 is a gate width measured in proximity to the top surface 503A of the semiconductor fin 503. In some embodiments, the lower width D2 is smaller than the upper width D1. When the upper width D1 is wider than the lower width D2, the gate 501 is referred to have a "notching" feature, as opposed to a "footing" feature where the upper width D1 is smaller than the lower width D2. It is provided in the present disclosure that gate 501 from different portion and/or different patterning density region of the substrate all have a "notching" feature.

Figure 6:
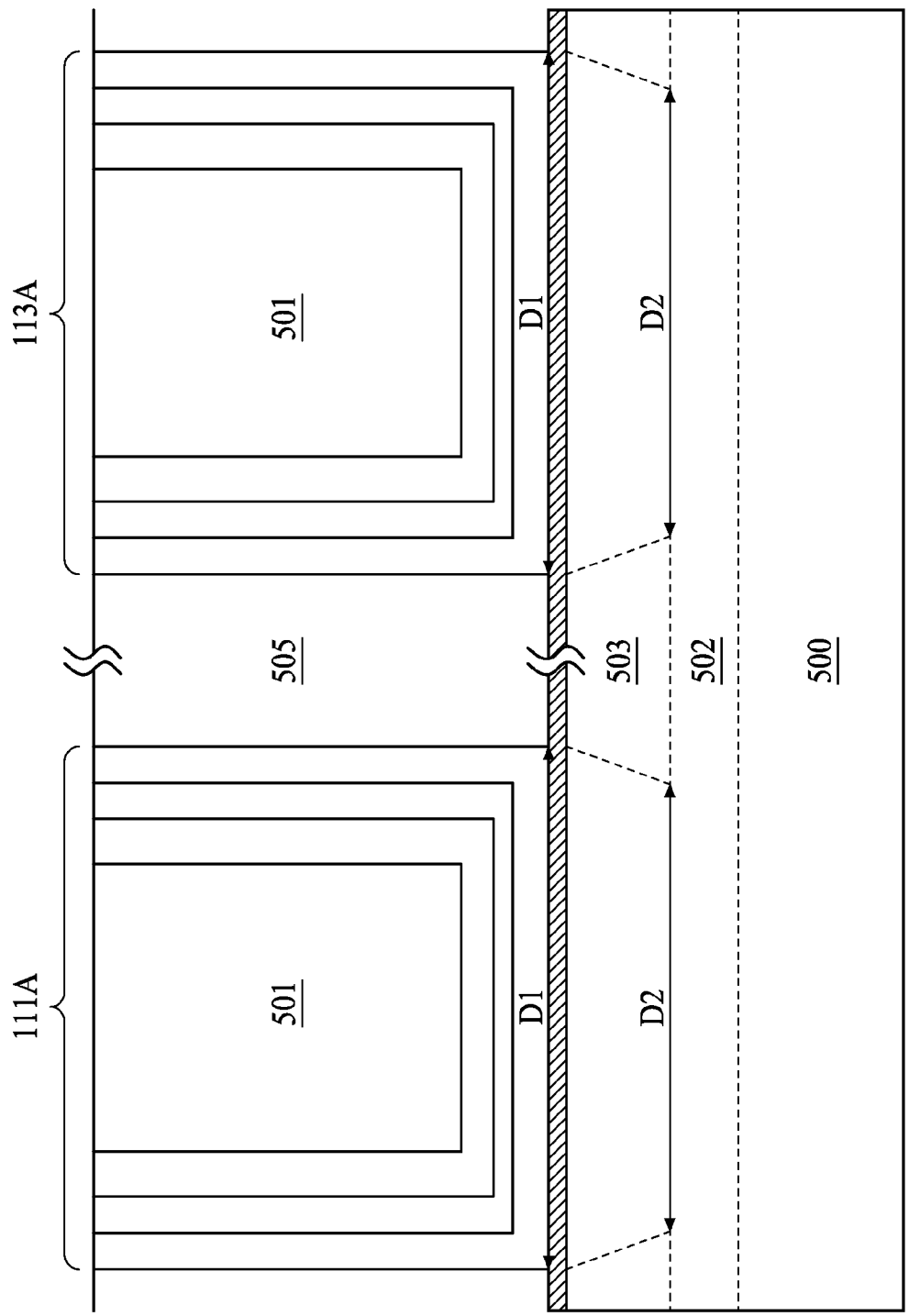
FIG. 6 shows a cross sectional view of an isolated-patterned FinFET structure in an edge portion and in a center portion, in accordance with some embodiments of the present disclosure.

Referring to FIG. 6, a semiconductor structure on two different dies of a semiconductor substrate is parallel arranged for the purpose of easy comparison. As previously discussed in FIG. 3A and FIG. 3B, semiconductor structure 111A is an isolated region of a die from a center portion of the substrate (hereinafter the "second iso gate 111A"), semiconductor structure 113A is an isolated region of a die from an edge portion of the substrate (hereinafter the "first iso gate 113A"). As shown in FIG. 6, the lower width D2 in both the first gate and the second gate is smaller than the upper width D1 of the first iso gate and the second iso gate, respectively. In some embodiments, a difference between the lower width D2 and the upper width D1 ("D1–D2") is below 15 nm. However, D1–D2 may be of different values in the first iso gate and the second iso gate. In some embodiments, D1–D2 of the second iso gate minus D1–D2 of the first iso gate is less than about 2.5 nm.

Figure 7:
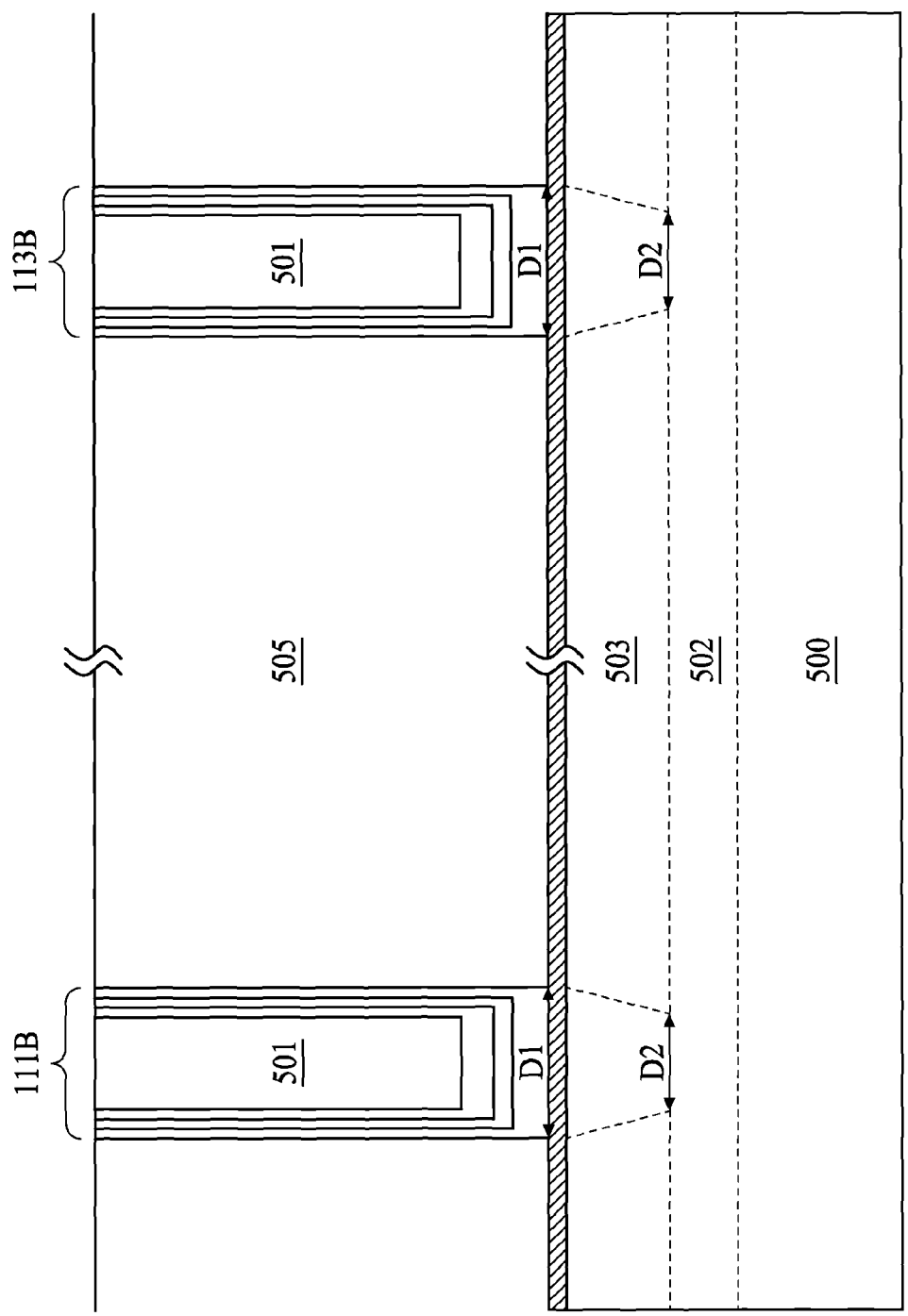
FIG. 7 shows a cross sectional view of a dense-patterned FinFET structure in an edge portion and in a center portion, in accordance with some embodiments of the present disclosure.

Referring to FIG. 7, a semiconductor structure on two different dies of a semiconductor substrate is parallel arranged for the purpose of easy comparison. As previously discussed in FIG. 3A and FIG. 3B, semiconductor structure 111B is a dense region of a die from a center portion of the substrate (hereinafter the "second dense gate 111B"), semiconductor structure 113B is a dense region of a die from an edge portion of the substrate (hereinafter the "first dense gate 113B"). As shown in FIG. 7, the lower width D2 in both the first dense gate and the second dense gate is smaller than the upper width D1 of the first dense gate and the second dense gate, respectively. In some embodiments, a difference between the lower width D2 and the upper width D1 ("D1–D2") is below 15 nm. However, D1–D2 may be of different values in the first dense gate and the second dense gate. In some embodiments, D1–D2 of the second dense gate and D1–D2 of the first dense gate is substantially identical.

Figure 8:
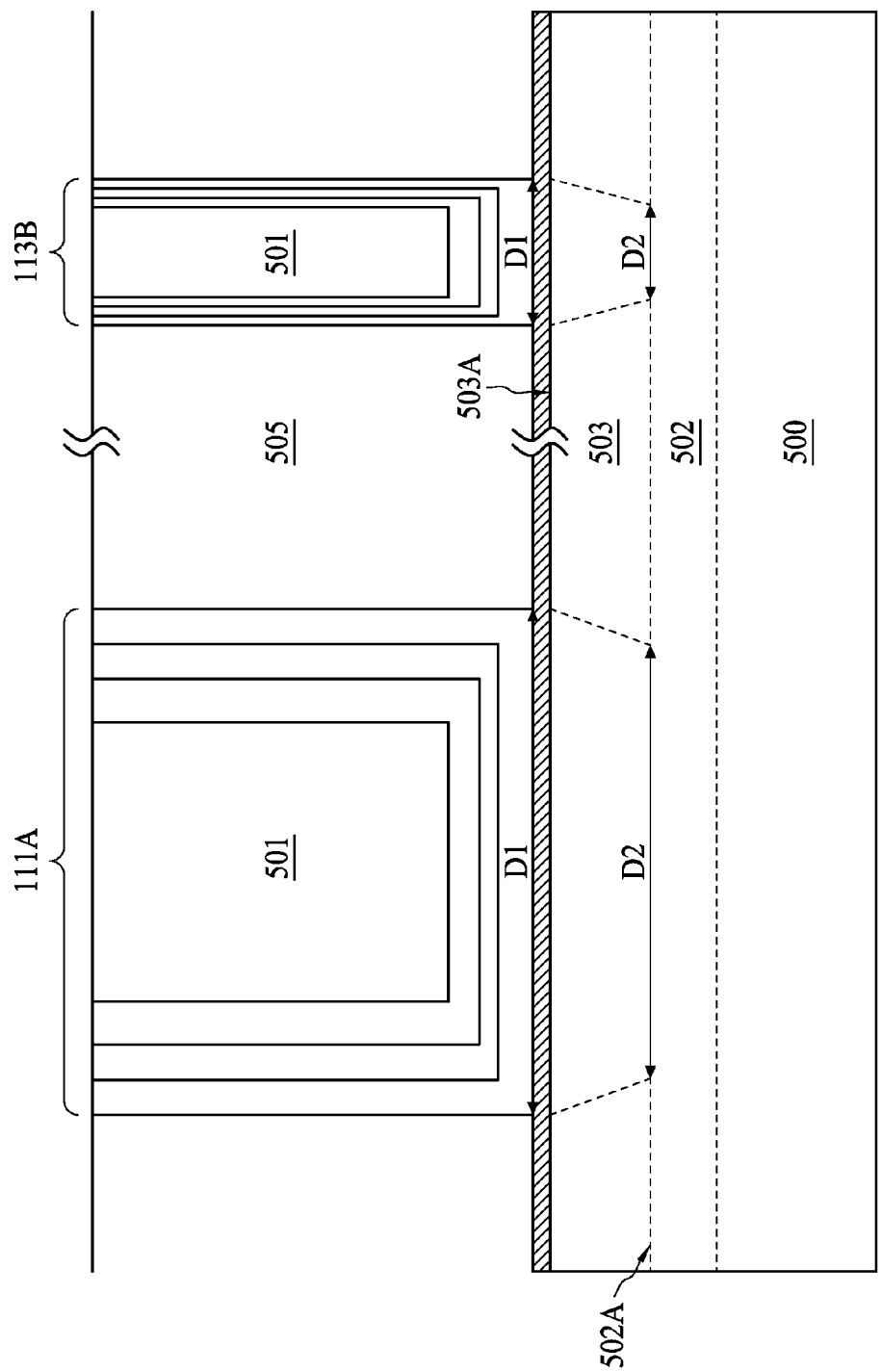
FIG. 8 shows a cross sectional view of a dense-patterned FinFET structure in an edge portion and an isolated-patterned FinFET structure in a center portion, in accordance with some embodiments of the present disclosure.
Figure 9:
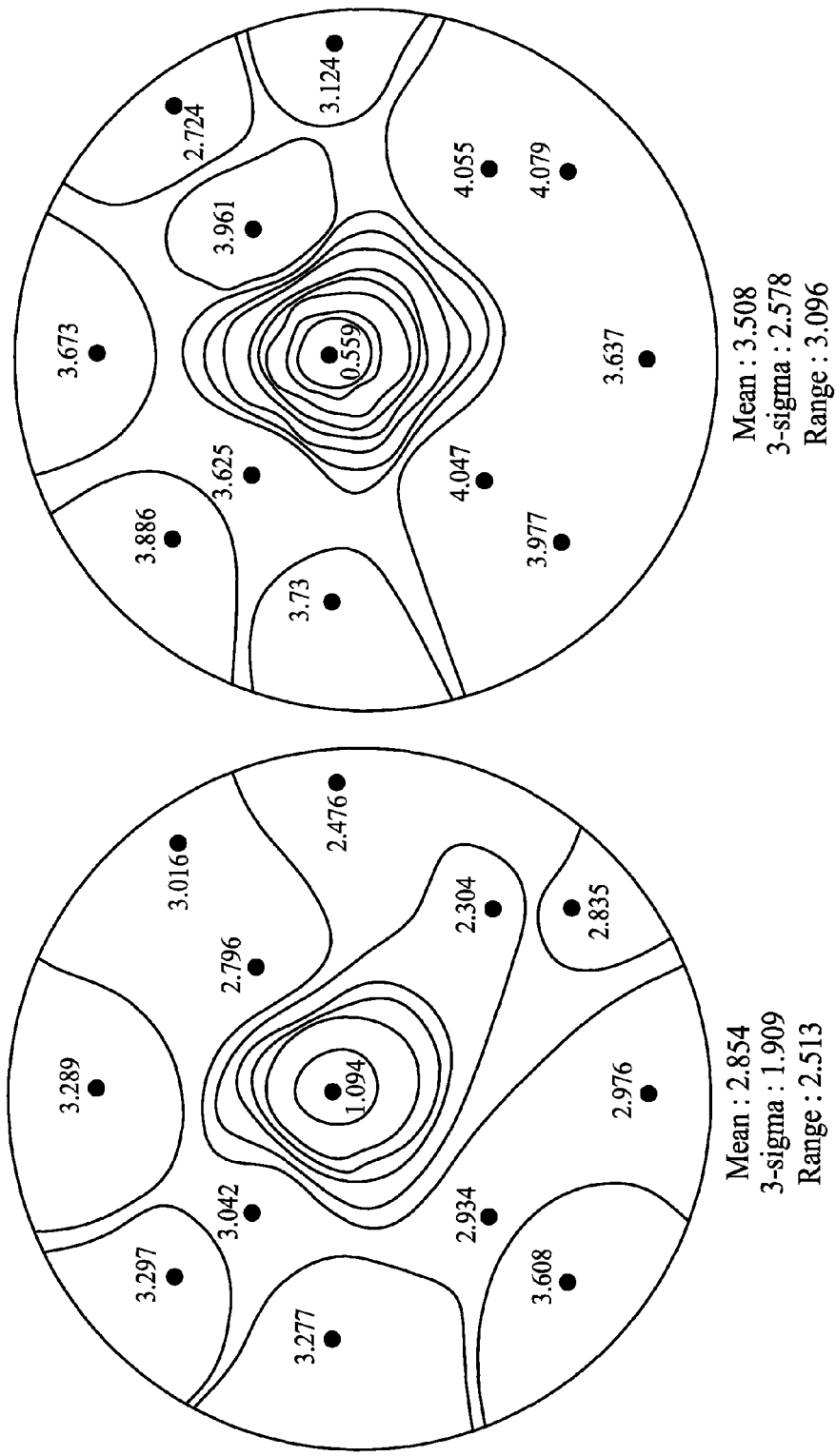
FIG. 9A shows a spectroscopic critical dimension mapping of a degree of notching, in accordance with some embodiments of the present disclosure.
FIG. 9B shows a spectroscopic critical dimension mapping of a degree of notching, in accordance with the conventional art.

Referring to FIG. 8, a semiconductor structure on two different dies of a semiconductor substrate is parallel arranged for the purpose of easy comparison. In FIG. 8, the gate 501 is a metal gate surrounding the top surface 503A and sidewall surfaces (not shown in FIG. 8) of the semiconductor fin 503. The sidewall surface of the semiconductor fin 503 can be referred to FIG. 10 of the present disclosure, where the sidewall surface 503B can be viewed from plane B in FIG. 4. As previously discussed in FIG. 3A and FIG. 3B, semiconductor structure 111A is an isolated region of a die from a center portion of the substrate (hereinafter the "second iso gate 111A"), semiconductor structure 113B is a dense region of a die from an edge portion of the substrate (hereinafter the "first dense gate 113B"). As can be seen in FIG. 8, a first metal gate width, directing to D2 of the first dense gate and/or D2 of the second iso gate, is smaller than a second metal gate width, directing to D1 of the first dense gate and/or D1 of the second iso gate. Note the first metal gate width referred herein includes all the D2 shown in the embodiments, and the second metal gate width includes all the D1 shown in the embodiments.

Referring to FIG. 8, in some embodiments, a difference between the first metal gate width D2 and the second metal gate width D1 ("D1–D2") is below 15 nm. Compared to the second iso gate 111A, the first dense gate 113B is situated in a dense region and hence having a second metal gate width D1 of from about 28 nm to about 32 nm. In some embodiments, a second metal gate width D1 of the second iso gate 111A is from about 235 nm to about 245 nm. In other words, the second metal gate width D1 in the isolated region of a die is about 10 times wider than the second metal gate width D1 in the dense region of the die. Considering the dense region in two different dies, one from an edge portion of the substrate, and another from a center portion of the substrate, a difference (D2–D1) between the first metal gate width D2 and the second metal gate width D1 is within a range of from about 1.5 nm to about 2.5 nm. Considering the dense region in two different dies, one from an edge portion of the substrate, and another from a center portion of the substrate, a difference (D2–D1) between the first metal gate width D2 and the second metal gate width D1 from an edge portion of a substrate and a difference (D2–D1) between the first metal gate width D2 and the second metal gate width D1 from a center portion of the substrate is substantially identical. Considering the isolated region in two different dies, one from an edge portion of the substrate, and another from a center portion of the substrate, a ratio of a difference (D2–D1) between the first metal gate width D2 and the second metal gate width D1 from an edge portion of a substrate and a difference (D2–D1) between the first metal gate width D2 and the second metal gate width D1 at a center portion of the substrate is below about 2.

Referring to FIGS. 9A and 9B, FIG. 9A is a spectroscopic critical dimension (SCD) mapping of a substrate or a wafer in some embodiment of the present disclosure, showing values of the difference (D2–D1) discussed above. FIG. 9B is the SCD mapping of a substrate or a wafer in conventional semiconductor structure, showing values of the difference (D2–D1) discussed above. The statistic data shown below the mapping indicates that semiconductor structure prepared according to the method disclosed in the present disclosure possesses a 3-sigma value of 1.909 nm, whereas the semiconductor structure conventionally prepared possesses a 3-sigma value of 2.578 nm. In some embodiments, a 3-sigma value of the difference between the lower width and the upper width measured by a spectroscopic critical dimension is below about 2 nm. Furthermore, the Range of (D2–D1) in semiconductor structure prepared according to the method disclosed in the present disclosure is about 2.513 nm, whereas the Range of (D2–D1) in semiconductor structure conventionally prepared is about 3.096 nm. In some embodiments, a Range of the difference between the lower width and the upper width measured by a spectroscopic critical dimension is below about 2.6 nm. The smaller 3-sigma value and the narrower Range in the present disclosure show better uniformity with respect to the difference (D2−D1) throughout the substrate or the wafer.

Figure 10:
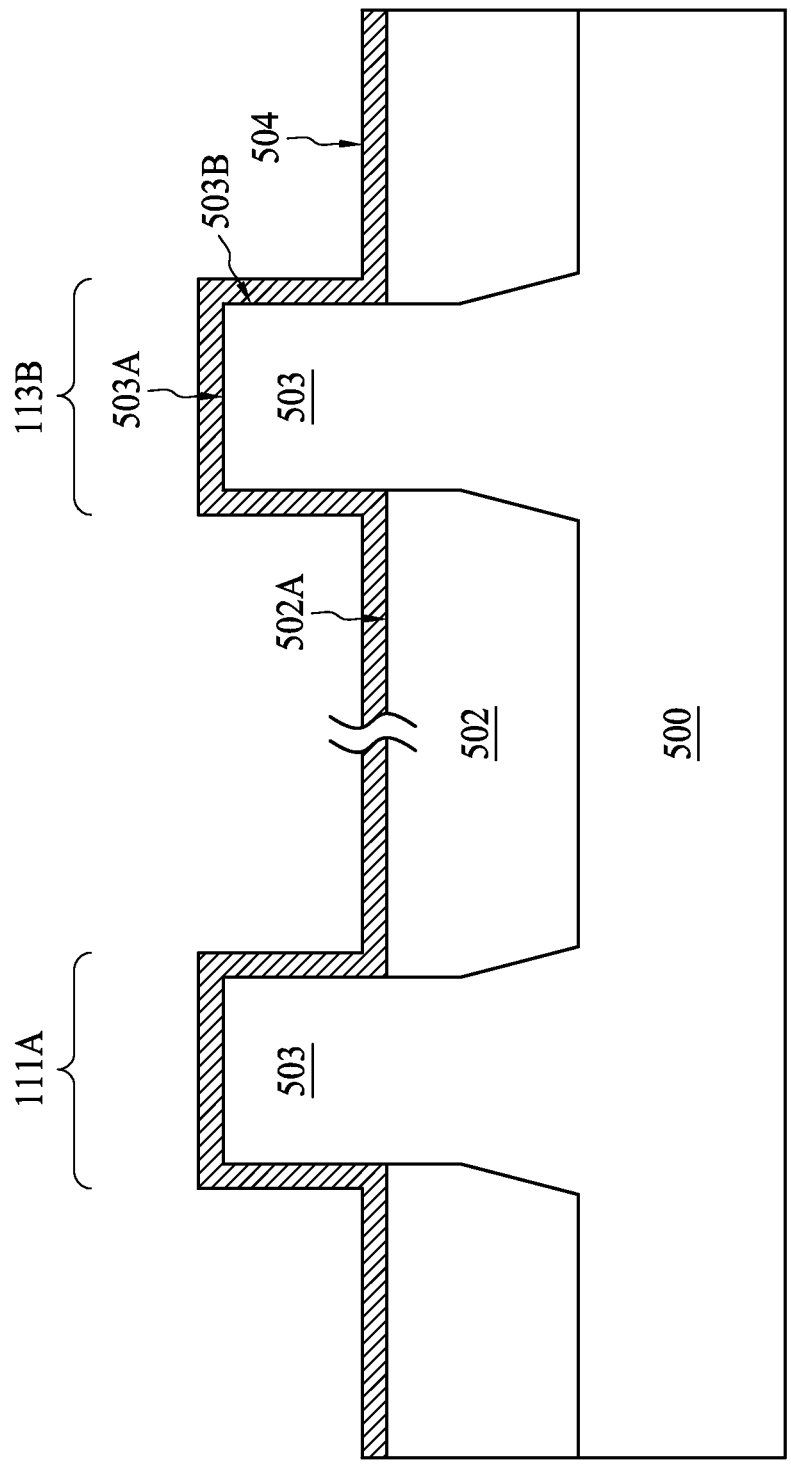
FIG. 10 to FIG. 16 show fragmental cross sectional views of a method for manufacturing a semiconductor structure on a substrate, in accordance with some embodiments of the present disclosure.

FIG. 10 to FIG. 16 show fragmental cross sectional views of a method for manufacturing a semiconductor structure on a substrate. In FIG. 10, a semiconductor fin 503 connecting to a substrate 500 is partially surrounded by an isolation layer 502, for example, an STI layer. A top portion of the semiconductor fin 503 is protruding from the isolation layer 502, having a top surface 503A and sidewall surfaces 503B. Note a high-k dielectric layer 504 can be formed over the protruding portion of the semiconductor fin 503 and a top surface 502A of the isolation layer 502. The high-k dielectric layer 504 may include silicon oxide, high-k dielectric material or combination thereof. A high-k dielectric material is defined as a dielectric material with a dielectric constant greater than that of $SiO_2$. The high-k dielectric layer 504 includes metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The high-k dielectric layer 504 may be grown by a thermal oxidation operation, a chemical vapor deposition (CVD) operation, an atomic layer deposition (ALD) operation, and may have a thickness less than 2 nm. In addition, an interfacial layer (not shown) can be formed between the high-k dielectric layer 504 and the protruding portion of the semiconductor fin 503 in order to minimize stress therebetween. The interfacial layer may be formed of silicon oxide or silicon oxynitride grown by a thermal oxidation process. For example, the interfacial layer can be grown by a rapid thermal oxidation (RTO) process or in a conventional annealing process comprising oxygen.

Figure 11:
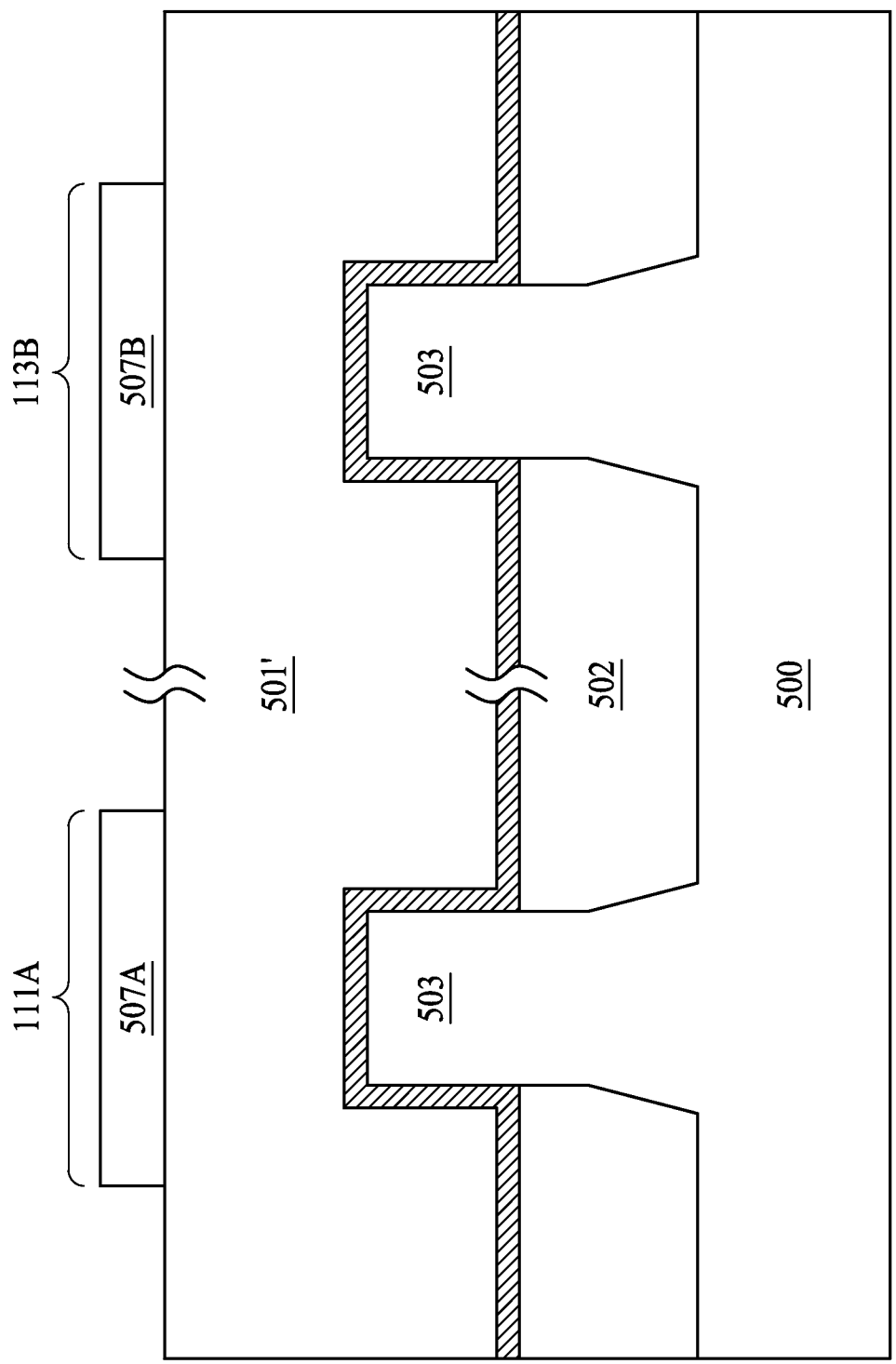
Figure 12:
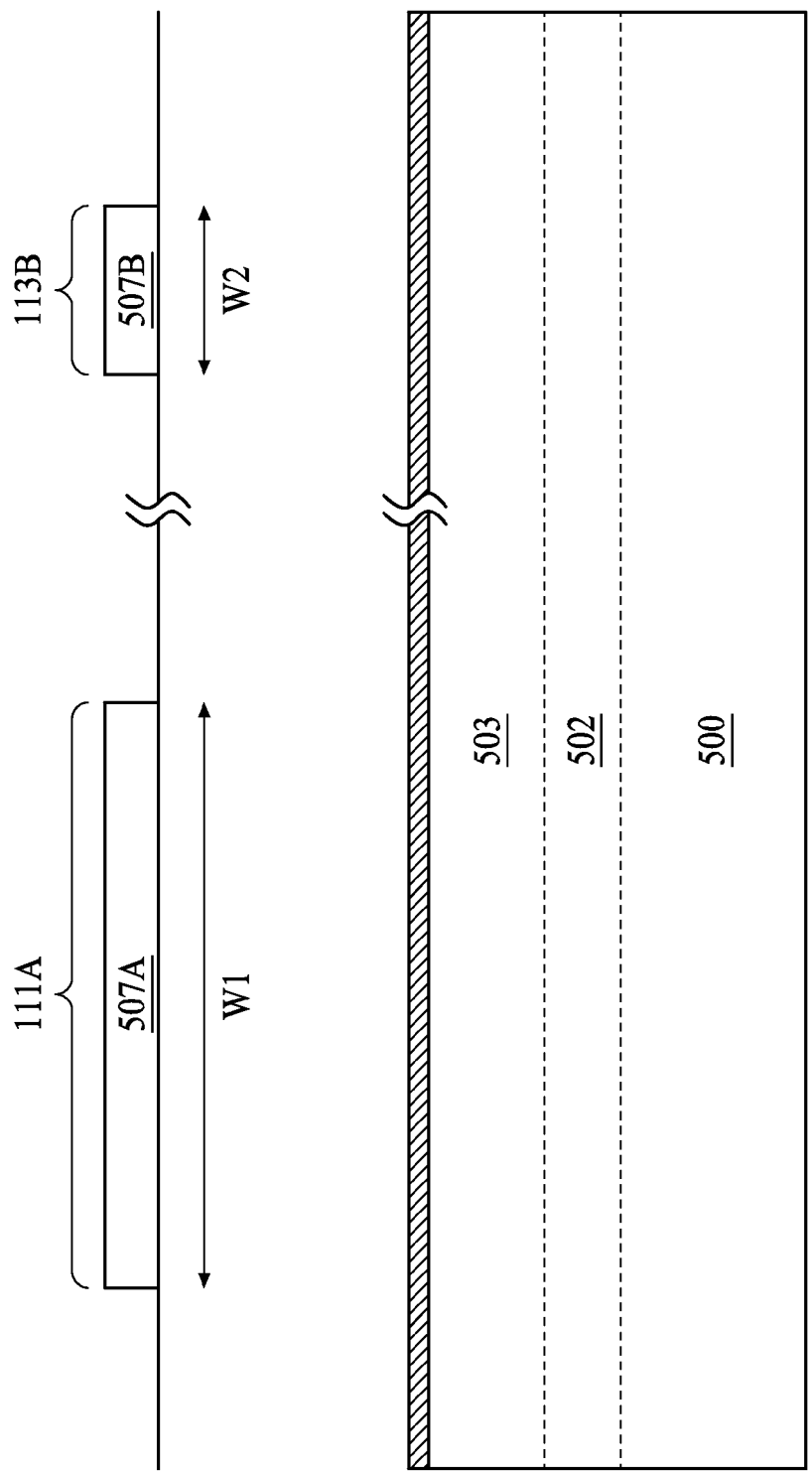

As discussed above, two semiconductor structure on different dies are parallel arranged in FIGS. 10-16 for the purpose of comparison. The left one is a second iso gate 111A, positioned on a center die of the wafer; the right one is a first dense gate 113B, positioned on an edge die of the wafer. Referring to FIG. 11 and FIG. 12, a dummy layer 501' is formed over the semiconductor fin 503 and the top surface 502A of the isolated layer 502, and a mask layer (507A, 507B) with predetermined width W1 and W2 is subsequently patterned over the dummy layer 501' using a suitable operation. FIG. 11 and FIG. 12 are cross sectional views of a semiconductor structure in a single operation, showing from mutually orthogonal perspectives (plane A and plane B) as discussed in FIG. 4. The dummy layer 501' may be polysilicon doped with uniform or gradient doping. The dummy layer 501' may have a thickness in the range of from about 30 nm to about 60 nm. The dummy layer 501' may be formed using a low-pressure chemical vapor deposition (LPCVD) process. As shown in FIG. 12, the mask layer (507A, 507B) is designed to produce a gate width W1 of the second iso gate 111A at least 8 times wider than a gate width W2 of the first dense gate 113B.

Figure 13:
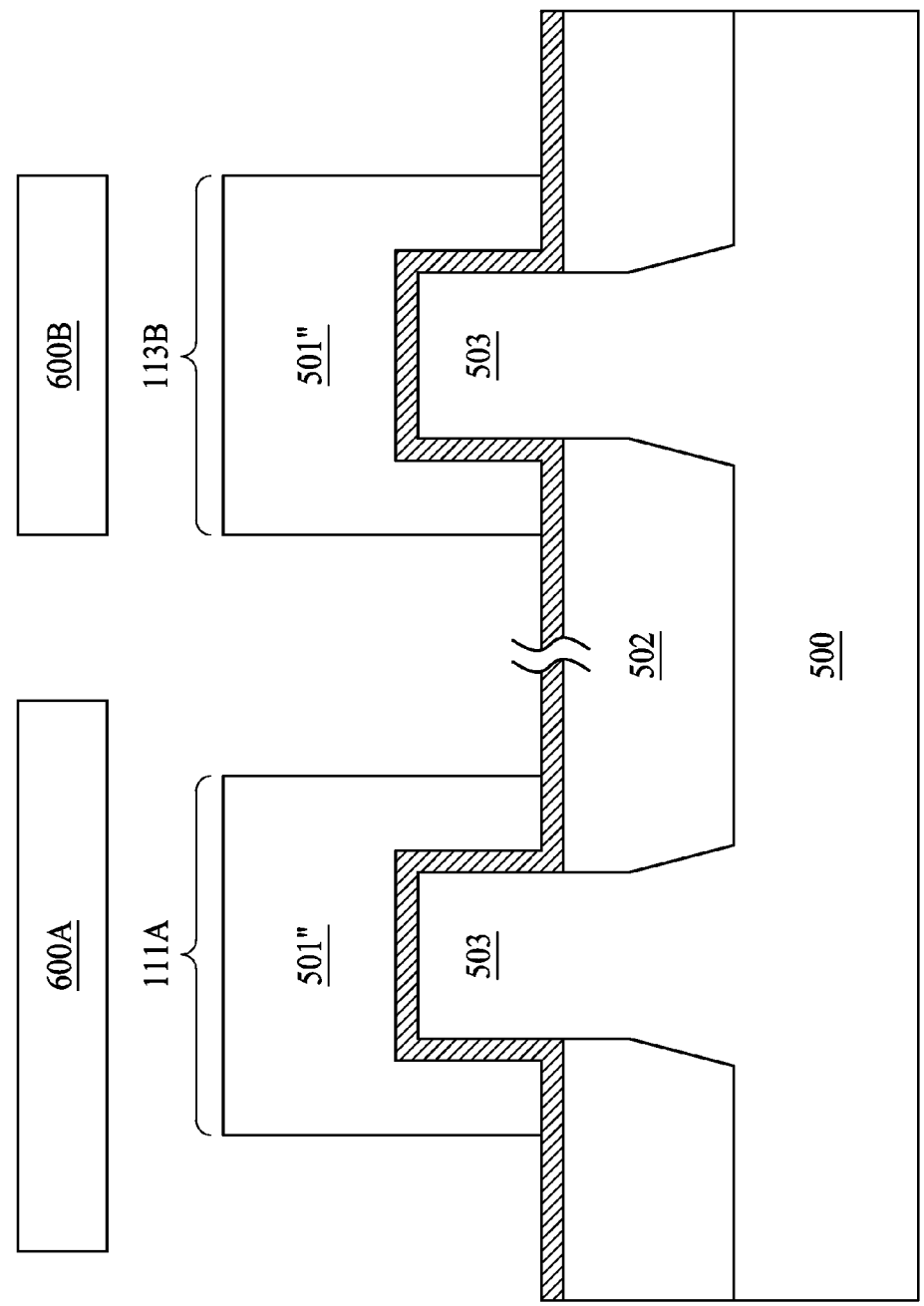

Referring to FIG. 13, a dummy gate 501" is obtained from the dummy layer 501' by an etching operation, for example, a dry etching operation. Present disclosure provides a dry etching method including a spatial etching gas mode change at the etching operation of forming a dummy gate 501". The etching gases can be injected into the chamber in a center mode or an edge mode. In the center mode, as illustrated in FIG. 13, gases are injected into the chamber mainly from a central injector 600A, preferably toward the center of the wafer. The dies closer and/or facing the center thus will have higher etching rates, while other dies will have lower etching rates. In the edge mode, etching gases are injected into the reaction chamber from more distributed locations that are away from the center, such as mainly from an edge injector 600B. When switched from center mode to edge mode, the etching rate at the center of the die decreases, and the etching rate at the edge of the die increases. In other words, the etching operation can be switched from a center mode to an edge mode at a predetermined time point.

Referring to FIG. 13, the edge mode and the center mode can be different from a flow rate point of view. For example, the total etching gases to be injected in to the chamber is fixed, only the portion coming out from the center injector 600A and from the edge injector 600B is different. In some embodiments, when the etching operation is switched to an edge mode, the flow rate of the etching gas at the edge injector 600B is 2 times the flow rate at the center injector 600A. However, the flow rate ratio of the present disclosure is not limited thereto. Other ratio may be used depending on different patterns on the wafer. Also the choice of time point to conduct the switching between the center mode and the edge mode can be predetermined depending on a case-by-case basis. For example, in some embodiments, the switching operation is conducted about half way of the entire etching operation.

Figure 14:
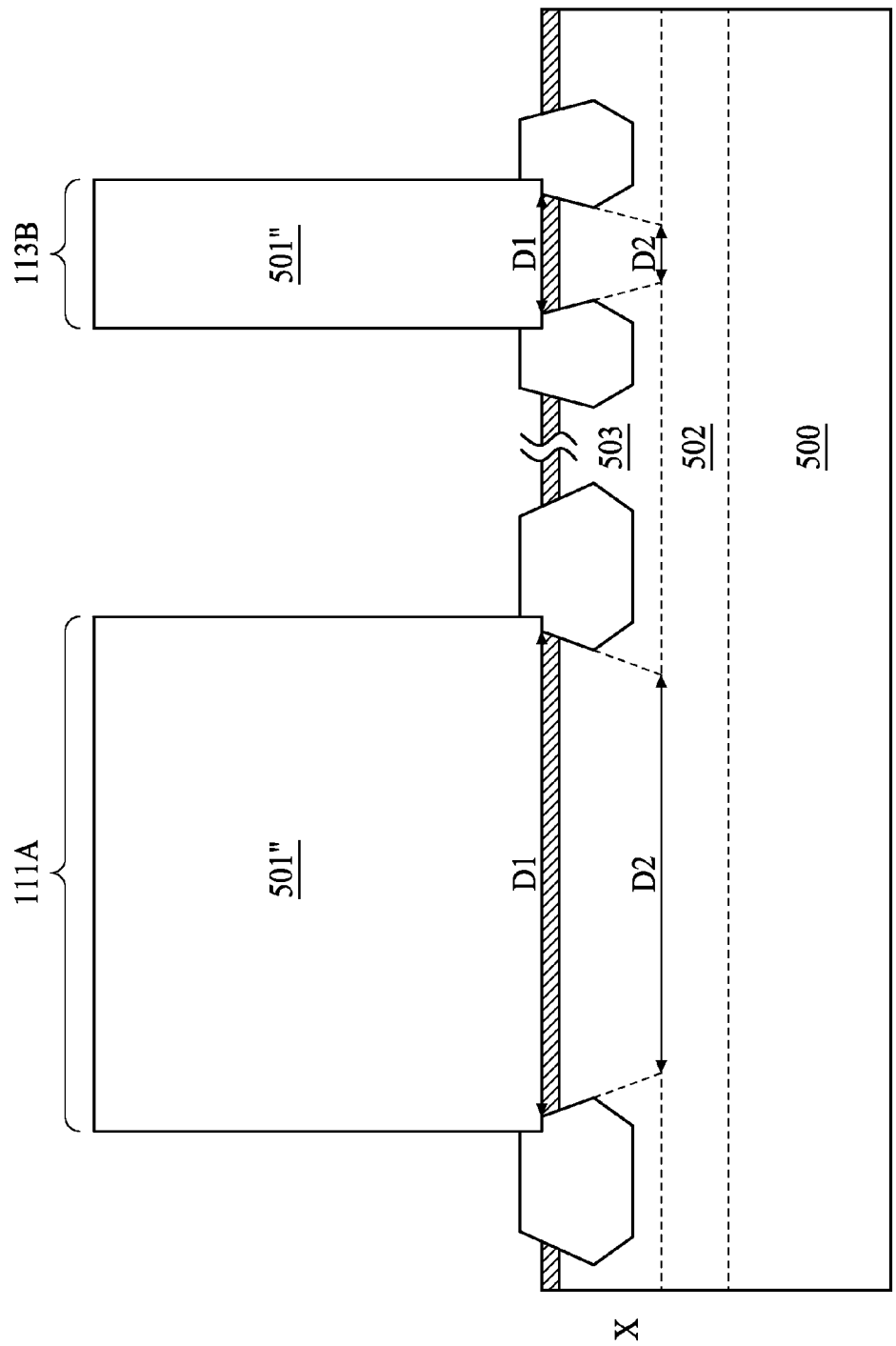

In FIG. 14, after the formation of dummy gates 501" with desired notching feature (i.e. D1>D2) according to the etching operation provided herein, epitaxy regions such as source and drain are formed in proximity to the upper width D1 of the dummy gate 501". Epitaxial growth operation is performed to fill recesses (not shown), so as to form several source and drain. Note different facets can be observed in both a raised portion and an embedded portion of the epitaxy region. In some embodiments, silicon germanium (often referred to as SiGe stressors) is epitaxially grown in the recesses 320, for example, using Selective Epitaxy Growth (SEG). In some exemplary embodiments, SiGe stressors are formed using Plasma Enhanced Chemical Vapor Deposition (PECVD). The precursors include Si-containing gases and Ge-containing gases, such as $SiH_4$ and $GeH_4$, respectively. During the epitaxy, the partial pressures of the Si-containing gases and Ge-containing gases are adjusted to modify the atomic ratio of germanium to silicon. The resulting SiGe stressors may have a germanium atomic percentage between about 10 atomic percent and about 50 atomic percent. In some embodiments, p-type impurities, such as boron and/or indium, are in-situ doped into SiGe stressors to a high concentration, which may be between about $10^{19}/cm^3$ and about $10^{21}/cm^3$, for example. In alternative embodiments, no p-type dopant is doped during the epitaxial growth of SiGe stressors. The top surface of SiGe stressors may be higher than the top surface 300A of substrate. SiGe stressors may include top portions and bottom portions that have different germanium percentages. For example, the germanium percentage of the top portions of SiGe stressors may be higher or lower than the germanium percentage of the lower portions of SiGe stressors. Note in FIG. 14, the second iso gate 111A and the first dense gate 113B possess notching features as discussed previously in FIG. 5 to FIG. 8. A uniformly distributed notching feature can effectively control the uniformity of the epitaxy region proximity. Great proximity control of the epitaxial source and drain can lead to better within-wafer device performance. The "x" mark shown in the left portion of FIG. 14 denotes a center portion of the substrate or the wafer, such that the second iso gate 111A is closer to the center portion than the first dense gate 113B does.

Figure 15:
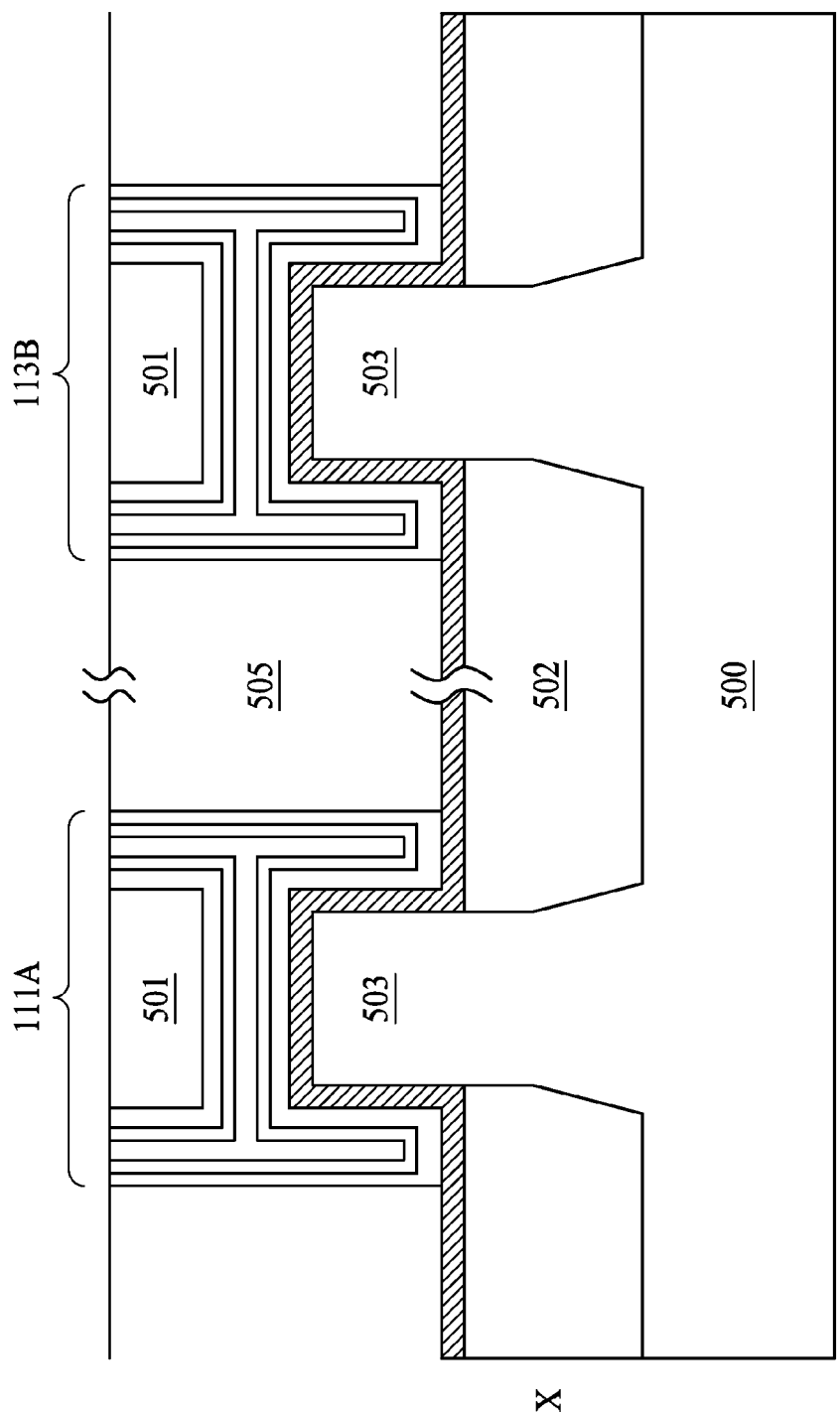
Figure 16:
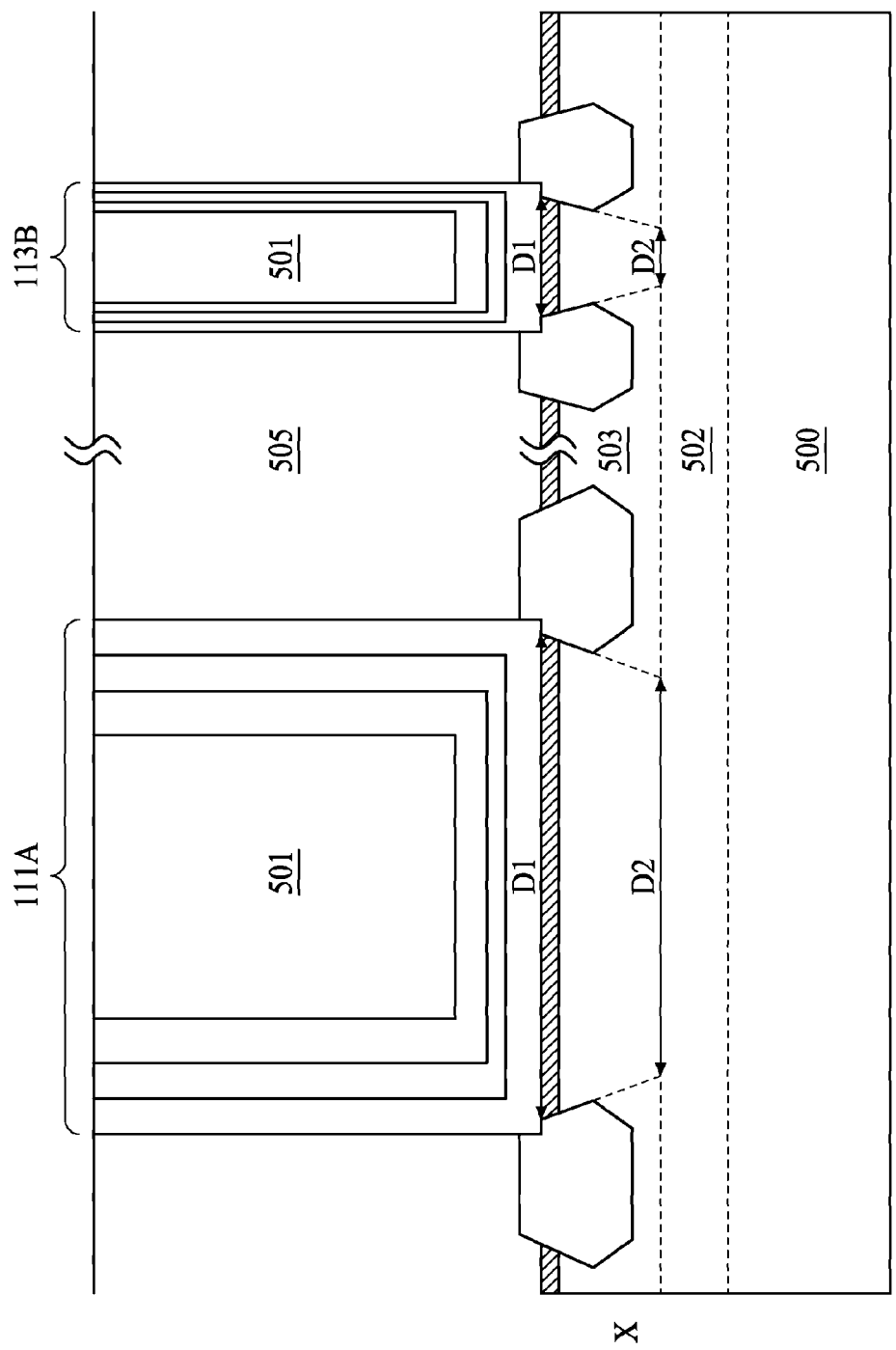

FIG. 15 and FIG. 16 are cross sectional views of a semiconductor structure in a single operation, showing from mutually orthogonal perspectives (plane A and plane B) as discussed in FIG. 4. A replacement gate operation is performed to replace the dummy gate 501" with a metal gate 501. Following FIG. 14, an interlayer dielectric layer (ILD) 505 is formed to surround the dummy gate 501", and the dummy gate 501" is removed using a wet etch and/or a dry etch operation. In at least one embodiment, the wet etch operation includes exposure to a hydroxide solution containing ammonium hydroxide, diluted HF, deionized water, and/or other suitable etchant solutions. In some embodiments, the dry etch operation may be performed under a source power of about 650 to 800 W, a bias power of about 100 to 120 W, and a pressure of about 60 to 200 mTorr, using $Cl_2$, HBr and He as etching gases.

Referring to FIG. 15 and FIG. 16, after the formation of a gate trenches (not shown) over in the ILD 505, a high-k cap layer or a barrier layer is conformally formed over the ILD and the gate trenches. Subsequently, a work function metal layer fills in the trench at both the second iso gate 111A and the first dense gate 113B. In some embodiments, the filled trenches may have a multi-layer structure such as a work function metal layer filled with a single metal layer. Different work function metal layers are formed in respective NFET and PFET, the processes require patterning a photoresist layer to protect regions of one type of device to form a metal gate in regions of the other type of device, and vice versa. Further, multiple work-function layers in a metal gate structure are generated as a result of reducing one patterning process. The filled trench becomes a metal gate electrode after a suitable planarization operation. The metal gate electrode essentially inherent the geometrical structure of the dummy gate 501", and hence the notching feature appeared in the dummy gate 501" can be transferred to the metal gate 501.

Some embodiments of the present disclosure provide a semiconductor structure, including a substrate having a center portion and an edge portion, an isolation layer over the substrate; a semiconductor fin with a top surface and a sidewall surface, partially positioning in the isolation layer, a first gate covering a portion of the top surface and a portion of the sidewall surface of the semiconductor fin, positioning at an edge portion of the substrate, and a second gate covering a portion of the top surface and a portion of the sidewall surface of the semiconductor fin, positioning at a center portion of the substrate. A lower width of the first gate in proximity to the isolation layer is smaller than an upper width of the first gate in proximity to top surface of the semiconductor fin.

In some embodiments of the present disclosure, the substrate further includes a dense gate region and an isolated gate region at the center portion and at the edge portion of the substrate.

In some embodiments of the present disclosure, a difference between the lower width and the upper width is below 15 nm.

In some embodiments of the present disclosure, a 3-sigma value of the difference between the lower width and the upper width measured by a spectroscopic critical dimension method is below about 2 nm.

In some embodiments of the present disclosure, a range of the difference between the lower width and the upper width measured by a spectroscopic critical dimension method is below about 2.6 nm.

In some embodiments of the present disclosure, a difference between the lower width and the upper width of the second gate in the isolated gate region minus a difference between the lower width and the upper width of the first gate in the isolated gate region is less than 2.5 nm.

In some embodiments of the present disclosure, a difference between the lower width and the upper width of the second gate in the dense gate region and a difference between the lower width and the upper width of the first gate in the dense gate region is substantially identical.

Some embodiments of the present disclosure provide a FinFET structure, including a semiconductor fin having a top surface and a sidewall surface, a metal gate over a portion of the semiconductor fin, surrounding the top surface and the sidewall surface of the semiconductor fin. A first metal gate width at a bottom of the metal gate is smaller than a second metal gate width at the top surface of the semiconductor fin.

In some embodiments of the present disclosure, a difference between the first metal gate width and the second metal gate width is below 15 nm.

In some embodiments of the present disclosure, the second metal gate width is in a range of from about 28 nm to about 32 nm.

In some embodiments of the present disclosure, the second metal gate width is in a range of from about 235 nm to about 245 nm.

In some embodiments of the present disclosure, a difference between the first metal gate width and the second metal gate width is in a range of from about 1.5 nm to about 2.5 nm.

In some embodiments of the present disclosure, a ratio of a difference between the first metal gate width and the second metal gate width at an edge portion of a substrate and a difference between the first metal gate width and the second metal gate width at a center portion of the substrate is below about 2.

In some embodiments of the present disclosure, a difference between the lower width and the upper width of the second gate in the dense gate region and a difference between the lower width and the upper width of the first gate in the dense gate region is substantially identical.

Some embodiments of the present disclosure provide a method for manufacturing a semiconductor structure on a substrate, including (i) forming a semiconductor fin partially surrounded by an isolation layer, (ii) forming a dummy layer over the semiconductor fin; patterning a mask layer with a predetermined width over the dummy layer, (iii) forming a dummy gate by an etching operation, including a spatial etching gas mode change, and (iv) replacing the dummy gate with a metal gate. A bottom width of the metal gate in proximity to the isolation layer is smaller than an upper width of the metal gate in proximity to the semiconductor fin.

In some embodiments of the present disclosure, the patterning the mask layer with the predetermined width includes patterning an isolated gate width 8 times greater than a dense gate width.

In some embodiments of the present disclosure, the forming the dummy gate by the etching operation includes the spatial etching gas mode change includes increasing a flow rate of the etching gas at an edge portion of the substrate.

In some embodiments of the present disclosure, the flow rate of the etching gas at the edge portion of the substrate and a flow rate of the etching gas at a center portion of the substrate is about 2:1.

In some embodiments of the present disclosure, the increasing the flow rate of the etching gas at the edge portion of the substrate includes controlling a gas injector in an etching chamber.

In some embodiments of the present disclosure, the method further includes forming an epitaxy region in proximity to the upper width of the metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate having a center portion and an edge portion;
    a plurality of semiconductor dies over the substrate, the edge portion including a region where at least one side of the semiconductor die being in contact with the circumference of the substrate;
    an isolation layer over the plurality of semiconductor dies;
    a semiconductor fin with a top surface and a sidewall surface, partially positioning in the isolation layer;
    a first gate covering a portion of the top surface and a portion of the sidewall surface of the semiconductor fin, positioning at the edge portion of the substrate; and
    a second gate covering a portion of the top surface and a portion of the sidewall surface of the semiconductor fin, positioning at the center portion of the substrate,
    wherein a lower width of the first gate in proximity to the isolation layer is smaller than an upper width of the first gate in proximity to top surface of the semiconductor fin.

2. The semiconductor structure of claim 1, wherein the substrate further comprises a dense gate region and an isolated gate region at the center portion and at the edge portion of the substrate.

3. The semiconductor structure of claim 1, a difference between the lower width and the upper width is below 15 nm.

4. The semiconductor structure of claim 3, a 3-sigma value of the difference between the lower width and the upper width measured by a spectroscopic critical dimension method is below about 2 nm.

5. The semiconductor structure of claim 3, a range of the difference between the lower width and the upper width measured by a spectroscopic critical dimension method is below about 2.6 nm.

6. The semiconductor structure of claim 2, a difference between the lower width and the upper width of the second gate in the isolated gate region minus a difference between the lower width and the upper width of the first gate in the isolated gate region is less than about 2.5 nm.

7. The semiconductor structure of claim 2, a difference between the lower width and the upper width of the second gate in the dense gate region and a difference between the lower width and the upper width of the first gate in the dense gate region is substantially identical.

8. A FinFET structure, comprising:
    a first semiconductor fin having a top surface and a sidewall surface;
    a first metal gate over a portion of the first semiconductor fin, surrounding the top surface and the sidewall surface of the first semiconductor fin, the first metal gate being positioned on a semiconductor die at an edge portion of a substrate the edge portion including a region where at least one side of the semiconductor die being in contact with the circumference of the substrate;
    wherein a first metal gate width at a bottom of the first metal gate is smaller than a second metal gate width at the top surface of the first semiconductor fin.

9. The FinFET structure of claim 8, wherein a difference between the first metal gate width and the second metal gate width is below 15 nm.

10. The FinFET structure of claim 9, wherein the second metal gate width is in a range of from about 28 nm to about 32 nm.

11. The FinFET structure of claim 9, wherein the second metal gate width is in a range of from about 235 nm to about 245 nm.

12. The FinFET structure of claim 10, a difference between the first metal gate width and the second metal gate width is in a range of from about 1.5 nm to about 2.5 nm.

13. The FinFET structure of claim 11, further comprising a second metal gate over a portion of a second semiconductor fin, surrounding the top surface and the sidewall surface of the second semiconductor fin, the second metal gate being positioned on a semiconductor die at a center portion of the substrate, wherein a third metal gate width at a bottom of the second metal gate is smaller than a fourth metal gate width at the top surface of the second semiconductor fin; and
    a ratio of a difference between the first metal gate width and the second metal gate width at an edge portion of a substrate and a difference between the third metal gate width and the fourth metal gate width at the center portion of the substrate is below about 2.

14. The FinFET structure of claim 10, further comprising a second metal gate over a portion of a second semiconductor fin, surrounding the top surface and the sidewall surface of the second semiconductor fin, the second metal gate being positioned on a semiconductor die at a center portion of the substrate, wherein a third metal gate width at a bottom of the second metal gate is smaller than a fourth metal gate width at the top surface of the second semiconductor fin; and
    a difference between the first metal gate width and the second metal gate width at the edge portion of a substrate and a difference between the third metal gate width and the fourth metal gate width at the center portion of the substrate is substantially identical.

15. A FinFET structure, comprising:
    a semiconductor fin having a top surface and a sidewall surface; and
    a first gate covering a portion of the top surface and a portion of the sidewall surface of the semiconductor fin, the first gate being positioned on a semiconductor die at an edge portion of the substrate, the edge portion including a region where at least one side of the semiconductor die being in contact with the circumference of the substrate;
    wherein a lower width of the first gate in proximity to a bottom of the sidewall surface is smaller than an upper width of the first gate in proximity to the top surface of the semiconductor fin.

16. The FinFET structure of claim 15, further comprising a second gate covering a portion of the top surface and a portion of the sidewall surface of the semiconductor fin, wherein a lower width of the second gate in proximity to the bottom of the sidewall surface is smaller than an upper width of the second gate in proximity to the top surface of the semiconductor fin.

17. The FinFET structure of claim 16, wherein the second gate is positioned at a center portion of the substrate.

18. The FinFET structure of claim 17, wherein the center portion and the edge portion of the substrate each comprises both a dense gate region and an isolated gate region.

19. The FinFET structure of claim 15, wherein a difference between the lower width of the first gate in proximity to a bottom of the sidewall surface and the upper width of the first gate in proximity to the top surface of the semiconductor fin is below 15 nm.

* * * * *